United States Patent [19]

Reyes et al.

[11] Patent Number: 4,685,030
[45] Date of Patent: Aug. 4, 1987

[54] SURFACE MOUNTED CIRCUITS INCLUDING HYBRID CIRCUITS, HAVING CVD INTERCONNECTS, AND METHOD OF PREPARING THE CIRCUITS

[75] Inventors: Jaime Reyes, Birmingham; David Allred, Troy, both of Mich.

[73] Assignee: Energy Conversion Devices, Inc., Troy, Mich.

[21] Appl. No.: 728,558

[22] Filed: Apr. 29, 1985

[51] Int. Cl.$^4$ .............................................. H05K 7/06
[52] U.S. Cl. .................... 361/400; 174/68.5; 361/402; 427/96; 427/99
[58] Field of Search ............ 427/252, 96, 99; 361/395, 397, 400, 402, 404, 406.7; 174/68.5, 525

[56] References Cited

U.S. PATENT DOCUMENTS

| | | | |
|---|---|---|---|
| 2,332,309 | 10/1943 | Drummond | 427/252 X |
| 2,759,848 | 8/1956 | Sullivan | 427/252 |
| 3,984,620 | 10/1976 | Robillard et al. | 361/401 X |
| 4,045,594 | 8/1977 | Maddocks | 427/99 x |
| 4,383,003 | 5/1983 | Lifshin et al. | 428/674 X |

FOREIGN PATENT DOCUMENTS

| | | | |
|---|---|---|---|
| 713679 | 7/1965 | Canada | 427/99 |
| 0089604 | 9/1983 | European Pat. Off. | 427/99 |
| 2810529 | 9/1978 | Fed. Rep. of Germany | 427/99 |

Primary Examiner—Arthur T. Grimley
Assistant Examiner—Jane K. Lau
Attorney, Agent, or Firm—Richard M. Goldman; Marvin S. Siskind

[57] ABSTRACT

A surface mounted circuit is disclosed. The circuit includes an insulating substrate, a chemical vapor deposited interconnect layer of conductive metal, as Cr, Fe, Co, Ni, W, Mo, Mn or mixtures thereof, and at least one circuit element. The surface mounted circuit includes an interfacial layer of W, Mo, Mn, or a mixtures thereof, chemical vapor deposition of an interconnect layer of Cr, Fe, Ni, Co, Mn, W, Mo, or mixtures thereof, and bonding of a circuit element atop the interconnect layer. Also disclosed is a support, adapted for use as a circuit board for a surface mounted circuit.

16 Claims; 2 Drawing Figures

SURFACE MOUNTED CIRCUITS INCLUDING HYBRID CIRCUITS, HAVING CVD INTERCONNECTS, AND METHOD OF PREPARING THE CIRCUITS

FIELD OF THE INVENTION

The field of the invention is surface mounted circuits, including hybrid circuits, supports adapted for use as supports for surface mounted circuits including hybrid circuits, and methods of making the surface mounted circuits including hybrid circuits.

BACKGROUND OF THE INVENTION

A surface mounted circuit, for example, a hybrid circuit, may contain one or more monolithic circuits or individual circuit elements, for example, transistors, capacitors, or the like, bonded to an insulating substrate with appropriate interconnections. Hybrid circuits offer isolation between components and permit the use of precise resistors and capacitors. Moreover, hybrid circuits offer the advantage of relatively low cost for applications where only a relatively small number of circuits are built. Additionally, for certain applications, hybrid circuits offer greater thermal stability integrated circuits.

In surface mounted circuits, for example, hybrid circuits, passive elements are fabricated and interconnected by either thick film processes or thin film processes. While these terms are relative, they are fairly well understood operationally.

In thick film circuits, resistors and interconnect patterns are printed on the insulating substrate by silk screen or similar processes. Pastes, for example, pastes of powder such as silver powders in organic binders, such as epoxy resins, are printed on the substrate, for example, through silk screens, and thereafter cured in an oven. This process allows resistors to be made having a resistance below the rate of value and then having their resistance increased, for example, by abrasion or ablation. Such corrections of resistance can be made quickly with automated procedures, wherein the resistance values are continually monitored during manufacturing. Similarly, ceramic chip depositors can be bonded into place in the interconnect pattern along with monolythic circuits and individual transistors.

In surface mounted circuits, including hybrid circuits, thin film technology allows for greater precision and miniaturization. Thin film interconnect patterns and circuit elements, as resistors, have heretofore been vacuum deposited, as by sputtering, on a glass or glazed ceramic substrate. The resistive films have heretofore been made by tantalum or another resistive metal, and the conductors and interconnects by aluminum or gold. In general, resistive materials are deposited by sputtering and pattern definition for the resistors and conductive paths, i.e., interconnects, is achieved by depositing the films through metal shields which contain appropriate openings or apertures.

While hybrid circuits offer higher reliability and lower cost in integrated circuits, full utilization of hybrid circuit technology is limited by the relatively thick geometry, the line wide definition being on the order of about 125 microns.

SUMMARY OF THE INVENTION

According to the invention herein contemplated, there is provided surface mounted circuits, including hybrid circuits, and a method of preparing them by chemical vapor deposition, especially low pressure chemical vapor deposition. The method of the invention results in durable circuit elements having a higher operational temperature range than heretofore available and in surface mounted circuits, including hybrid circuits, produced at lower cost, with readily patternable interconnect material offering a finer pattern with one micron geometry. Moreover, the resulting interconnects are readily bondable, that is, readily solderable.

According to the invention herein contemplated, there is provided a surface mounted circuit comprising an insulating substrate, with at least one circuit element on the substrate. The circuit element is bonded to the structure by chemical vapor deposited interconnect means interconnecting the circuit elements and bonding the circuit elements to the substrate. As herein contemplated, the interconnect means are formed of a chemical vapor deposited transition metal that forms a volatile carbonyl. There include chromium, manganese, iron, cobalt, nickel, tungsten, and molybdenum, or mixtures thereof. According to a particularly preferred embodiment, an interfacial layer is present between the insulating substrate and the interconnect layer. Typically, the interfacial layer is formed of chemical vapor deposited tungsten, molybdenum, manganese, or mixtures or compounds thereof and has a thickness sufficient to provide adhesion, for example, from about 100 angstroms to about 1 micron.

As herein contemplated, the term interconnect means includes external circuit means, as in a surface mounted circuit having but one circuit element, interconnect means between circuit elements on a single hybrid circuit board, bonding alloys that form an eutectic bond with silicon chips, thereby bonding them to a circuit board, and sealing alloys that seal ceramic packaged circuits.

Additionally, the invention herein contemplated includes a support adapted for use as a circuit board. The support includes an insulating substrate and an interconnect layer atop the substrate comprising the chemical vapor deposited metal chosen from the group consisting of manganese, chromium, iron, cobalt, nickel, molybdenum, tungsten, and mixtures thereof. The support further includes an interfacial film thereon which comprises a chemical vapor deposited metal chosen from the metal consisting of tungsten, molybdenum, manganese, and mixtures and compounds thereof.

According to the invention herein contemplated, the surface mounted circuit is assembled on an insulating substrate by chemical vapor depositing an interfacial layer on the insulating substrate, and thereafter chemically deposited an interconnect layer on the interfacial substrate. At least one circuit element is bonded atop the interconnect layer. The interfacial layer is formed by chemical vapor deposition of a metal chosen from the group consisting of tungsten, molybdenum, manganese, and mixtures thereof to a thickness of from about 100 angstroms to about 1 micron. The interconnect layer is deposited atop the interfacial layer by chemical vapor deposition of a metal chosen from the group consisting of chromium, iron, cobalt, nickel, tungsten, molybdenum, manganese, and mixtures thereof. The interconnect layer is deposited to a thickness of from about 1000 angstroms to about 10 microns.

According to a preferred exemplification herein contemplated, the interconnect layer is deposited from the evaporation a liquid carbonyl, for example, nickel carbonyl, or cobalt carbonyl nitrosyl, or the sublimation of a solid carbonyl, for example, cobalt octacarbonyl.

According to the invention herein contemplated, chemical vapor deposition is carried out by heating the substrate uniformly to a temperature higher than the temperature of the chamber walls. The heating may be done by a heat exchange fluid, contact heat, infrared, conduction heating, resistance heating or the like. Thereafter, the material to be deposited is introduced into the low pressure deposition chamber and deposited, e.g., by pyrolysis or reduction, on the substrate.

The resulting chemical vapor deposited interconnect is characterized by durability, temperature resistance, low cost and readily patternable at a pattern having one micron geometry. Moreover, the resulting chemical vapor deposited nickel or cobalt surface is characterized by a high degree of bondability or solderability of circuit elements thereto.

THE FIGURES

The invention may be understood by reference to the Figures.

DETAILED DESCRIPTION OF THE INVENTION

Figure 1:
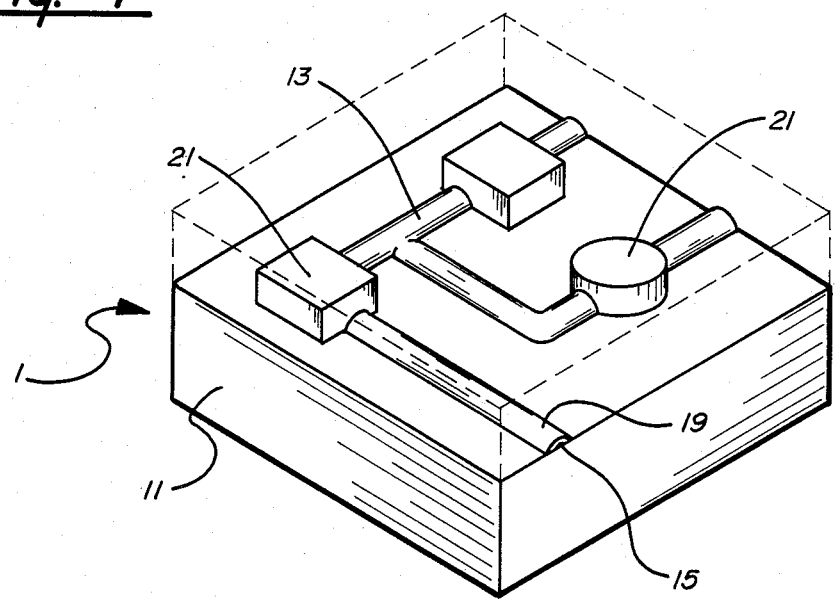
FIG. 1 is a isometric, schematic view of a surface mounted circuit having circuit elements thereon.

FIG. 1 is a isometric, schematic view of a surface mounted circuit 1. Surface mounted circuit 1 includes an insulating substrate 11. On the insulating substrate 11 is shown a pattern of interconnects 13. The individual interconnects 13 include an interfacial layer 15 and an external or interconnect layer 19. The interconnects both connect individual circuit elements 21 and serve as leads to the surface mounted circuit 1.

The surface mounted circuit 1 may be a single element 21 mounted on the substrate 11, e.g., a silicon chip mounted by eutectic bonding with a chemical vapor deposited tungsten interconnect film or layer 19. Alternatively, the surface mounted circuit 1 may be a hybrid circuit having a plurality of circuit elements 21 thereon connected by interconnects 13. When the surface mounted circuit 1 is a hybrid circuit, the interconnect means 13 are patterned interconnect means.

Interconnect means 13 are formed of chemical vapor deposited materials exemplified by chemical vapor deposited manganese, chromium, iron, cobalt, nickel, molybdenum, tungsten, and codeposited mixtures thereof. The chemical vapor deposited interconnect means includes the chemical vapor deposited interconnect layer 19 having a thickness of from about 1000 angstroms to about 10 microns. The interconnect means 13 are characterized by a geometry on the order of about 1 micron.

In a preferred exemplification, the interconnect means 13 further includes an interfacial layer 15 between the insulating substrate 11 and the interconnect layer 19. The interfacial layer 15 increases the adhesion of the interconnect layer 19 to the insulating substrate 11.

The interfacial layer 15 is formed of a chemical vapor deposited material, for example, tungsten, manganese, or mixtures thereof and is generally from about 100 angstroms to about 1 micron thick.

According to a further exemplification of the invention, there is provided a support adapted for use as a circuit board for a hybrid circuit or a surface mounted external circuit. The support includes an insulating substrate 11 having an interfacial film 15 thereon. The interfacial film 15 comprises a chemical vapor deposited metal chosen from the group consisting of tungsten, manganese, and mixtures thereof at an interconnect layer atop the interfacial film comprising a chemical vapor deposited metal chosen from the group of metals that form volatile carbonyls, e.g. tungsten, molybdenum, and the first order transition metals that form volatile carbonyls (cr, $M_nFr$, Co, Ni) and mixtures thereof. While the invention is described with respect to insulating substrate, the method of chemical vapor deposition of cobalt, nickel, tungsten, molybdenum, or mixtures thereof may be used to seal ceramic packages 21.

In both surface mounted circuits and the support adapted for use in a surface mounted circuit, the insulating substrate may be alumina, $Al_2O_3$, or silica, $SiO_2$, and is preferably an electronic grade material characterized by the substantial absence of migrating impurities.

According to a preferred exemplification of the invention, the surface mounted circuit 1 on the insulating substrate is assembled by chemical vapor depositing an interfacial layer 15 on the substrate 11. After chemical vapor deposition of the interfacial layer 15, an interconnect layer 19 is deposited atop the interfacial layer 15. Then a circuit element or elements 21 are bonded atop the interconnect layer 19.

Either prior to or subsequent to deposition or bonding of the circuit elements 21 to the interconnect means 13, photolithographic techniques may be utilized, as are well known in the art to pattern the interconnect means 13 in order to isolate circuit elements 21 from certain circuit elements 21 while providing electrical connection between other circuit elements 21.

According to a preferred exemplification of the invention, the interfacial layer is formed by chemical vapor depositing a metal chosen from the group consisting of tungsten, molybdenum, manganese, and mixtures thereof onto the insulating substrate. The chemical vapor deposition is continued to provide a thickness of from about 1000 angstroms to about 1 micron. Thereafter, the interconnect layer is formed atop the interfacial layer by chemical vapor deposition of a metal from the group consisting of cobalt, nickel, and mixtures thereof. The interconnect layer 19 is deposited to a thickness of from about 1000 angstroms to about 10 microns.

As herein contemplated, the interconnect layer may be deposited from an evaporated liquid carbonyl, e.g., exemplified by nickel carbonyl, $Ni(CO)_4$ or cobalt carbonyl nitrosyl, $Co(CO)_3NO$. Alternatively, the interconnect layer 19 may be deposited by the vacuum sublimation of a solid precursor under conditions that result in chemical vapor deposition on substrate 11. For example, a deposition may be carried out using dicobalt octacarbonyl $Co_2(CO)_8$.

It has been reported in the literature the two basic parameters cover the deposition rate and uniformity of films by low pressure chemical deposition. These parameters are the rate of mass transfer of reactant gases to the substrate surface 11 and the rate of surface of the reactant gases at the substrate surface. Mass transfer of the gases is believed to involve the diffusion across a slowly moving boundary layer adjacent to the surface of the substrate 11. The thinner the boundary layer and the higher the diffusion rate, the greater the mass transport across the diffusion layer. Surface reaction rates at the surface of the insulating substrate 11 depend mainly upon concentration of reactant in the gas stream and the temperature of the substrate. Low pressure chemical vapor deposition of nickel carbonyls and cobalt carbonyls enhance mass transfer and allow high deposition rate and high throughput formation of the interconnect layer 13.

Figure 2:
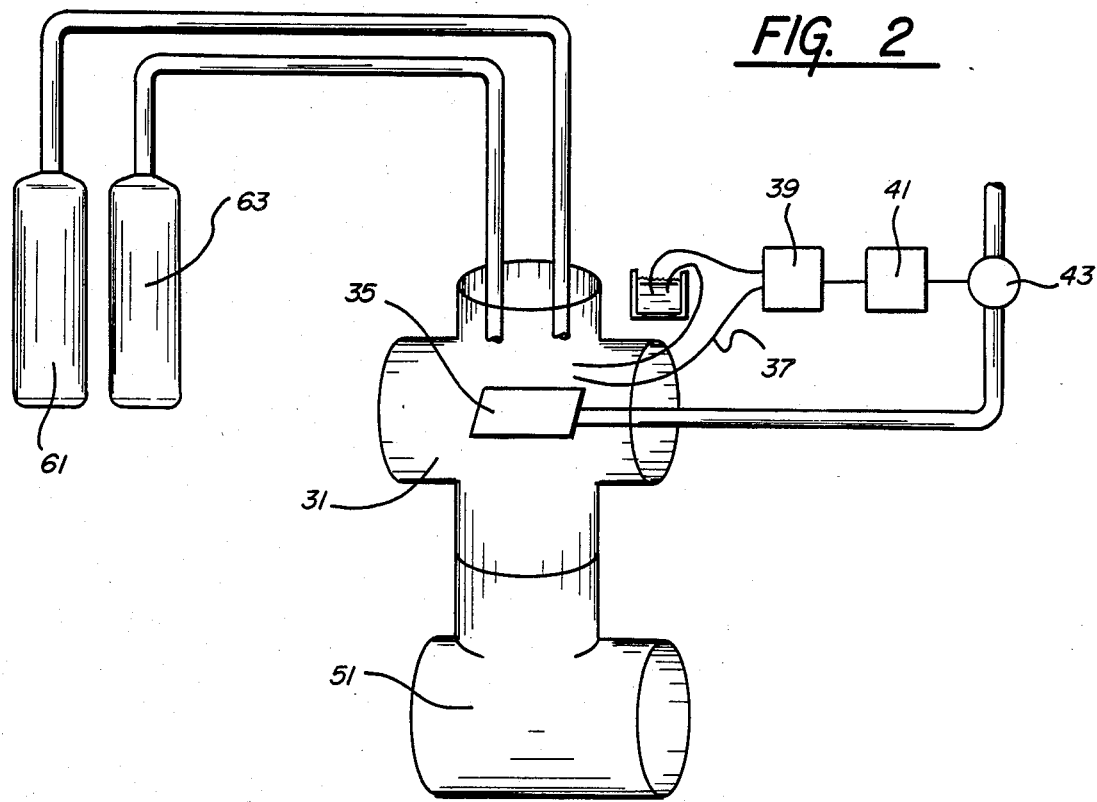
FIG. 2 is a schematic view of a batch deposition system useful in the method of the invention.

Basic apparatus for low pressure chemical vapor deposition includes a tubular furnace substrate holder for holding the substrates, gas flow system, vacuum pump, and exhaust provisions. The chemical vapor deposition apparatus shown in FIG. 2 includes a vacuum chamber 31. Within the vacuum chamber 31 is a substrate heater 35. The temperature of the substrate heater 35 is measured through thermal couple leads 37 going through a metering instrument as a Multi-Meter 39 to control a temperature controller 41, and through a rheostat. The vacuum chamber is maintained under vacuum by a vacuum pump 51. Gas is introduced into the system through gas cylinders, for example, gas cylinder 63. Gas flow rate may be controlled so as to sequentially deposit first the interfacial layer 15 and thereafter the interconnect layer 19.

While the vacuum deposition CVD system here shown is a vertical system where the gas flow is vertical, it is to be understood that horizontal systems may be used with horizontal gas flow.

In the method herein contemplated to prepare the contemplated electronic circuits and interconnect layers, the temperature of the substrate is maintained at from about 100° to about 400° C. and preferably from about 160° to about 260° C. and in the particularly preferred embodiment at from about 175° to 225° C. for nickel, and from 1OO° C. to 140° C. for dicobalt octacarbonyl, $Co_2(CO)_8$. This last temperature range provides particularly high degree of adhesions and particularly desirable conductivity properties.

The absolute pressure of the vacuum chamber 31 is typically maintained to below about 5 torr. In this way, particularly satisfactory results are obtained. Deposition rates utilizing the temperatures and vacuums herein contemplated are on the order of about 0.1 micron to about 5 microns per minute.

The following examples are illustrative of the invention.

EXAMPLES

A seris of tests were conducted to deposit a metal film atop an insulating substrate. In each test a quartz or an alumina wafer was placed on an electric resistance substrate heater. The substrate heater was then placed in a vacuum deposition chamber. The vacuum depostion chamber was pumped down to an absolute pressure of less than 5 torrs.

Thereafter the substrate heater was turned on, and the heater controlled with a substrate surface temperature thermocouple through a Keithley 169 Multimeter, an Omega temperature controller, and a Variac rheostat. Gaseous CVD reagents, i.e,. $Co(CO)_3NO$ and $Ni(CO)_4$ were introduced into the deposition chamber either with a carrier gas or alone. Solid CVD reagents were sublimated in the deposition chamber.

The following results were obtained with gaseous $Ni(CO)_4$:

| Example | Substrate Temp (°C.) | $Ni(CO)_4$ Pressure (Torrs) | Time (Min.) | Thickness (Microns) | Conductivity (ohm$^{-1}$ cm$^{-1}$) |
|---|---|---|---|---|---|
| I | 102 | 0.68 | 10 | 0.15–0.21 | $4.78 \times 10^4$ |
| II | 197 | 1.94–2.00 | 0.78 | 0.22–0.74 | $8.26 \times 10^4$ |
| III | 200 | 1.93 | 1.0 | 0.18–0.28 | $1.50 \times 10^4$ |
| IV | 199 | 1.89 | 2.0 | 0.84–4.5 | $5.91 \times 10^4$ |

The following results were obtained with solid $Co_2(CO)_8$:

| Example | Substrate Temp (°C.) | Total Pressure (Torrs) | Time (Min.) | Thickness (Microns) | Conductivity (ohm$^{-1}$ cm$^{-1}$) |
|---|---|---|---|---|---|
| V | 73 | 0.50 | 30 | 0.05–0.33 | $1.83 \times 10^5$– $1.87 \times 10^5$ |

The following results were obtained with gaseous $Co(CO)_3NO$:

| Example | Substrate Temp (°C.) | Total Pressure (Torrs) | Time (Min.) | Thickness (Microns) | Conductivity (ohm$^{-1}$ cm$^{-1}$) |
|---|---|---|---|---|---|
| VI | 295 | 4.6 | 1.0 | 3.2–15 | $9.50 \times 10^2$– $1.61 \times 10^3$ |

While the invention has been described with respect to certain preferred exemplifications and embodiments thereof, it is not intended that the scope of protection be limited thereby, but solely by the claims appended hereto.

We claim:
1. A method of forming a surface mounted circuit on an insulating substrate comprising the steps of:
   (a) chemical vapor depositing an interfacial layer on the insulating substrate; said interfacial layer formed of a metal chosen from the group consisting of tungsten, molybdenum, manganese, and mixtures, thereof;
   (b) thereafter chemical vapor depositing an interconnect layer atop the interfacial layer; said interconnect layer being formed of a metal chosen from the group consisting of manganese, chromium, iron, cobalt, nickel, molybdenum, tungsten, and mixtures thereof; and
   (c) bonding a circuit element atop the interconnect layer.
2. The method of claim 1 comprising forming the interfacial layer by chemical vapor depositing a metal chosen from the group consisting of tungsten, molybdenum, manganese, and mixtures thereof.
3. The method of claim 2 comprising chemical vapor depositing the interfacial layer to a thickness of from about 100 angstroms to about 1 micron.
4. The method of claim 1 comprising forming an interfacial layer on the substrate and forming the interconnect layer atop the interfacial layer by chemical vapor depositing a metal chosen from the group consisting of manganese, chromium, iron, cobalt, nickel, molybdenum, tungsten, and mixtures thereof.
5. The method of claim 4 comprising chemical vapor depositing the interconnect layer to a thickness of about 1000 angstroms to 10 microns.

6. The method of claim 1 comprising sequentially depositing the interfacial layer and the interconnect layer in a single vacuum pumping cycle.

7. The method of claim 1 comprising depositing the interconnect layer from a gaseous carbonyl.

8. The method of claim 7 wherein the gaseous carbonyl is chosen from the group consisting of Ni(CO)$_4$, Co(CO)$_3$NO, and mixtures thereof.

9. The method of claim 7 comprising maintaining the substrate at a temperature of from about 45° C. to about 400°.

10. A surface mounted circuit comprising:
 a. an insulating substrate;
 b. a chemical vapor depositied interfacial layer formed of a metal chosen from the group consisting of tungsten, molybdenum, manganese, and mixtures thereof on the substrate;
 c. at least one circuit element on said substrate; and
 d. adherent, chemical vapor deposited interconnect means in contact with the interfacial layer and the circuit element, providing an electrical connection for the circuit element and bonding the circuit element to the substrate; said interconnect means being formed of a metal chosen from the group consisting of manganese, chromium, iron, cobalt, nickel, tungsten, molybdenum, and mixtures thereof.

11. The surface mounted circuit of claim 10 wherein the interfacial layer is from about 100 angstroms to about 1 micron.

12. The surface mounted circuit of claim 10 wherein the interconnect means are external circuit leads.

13. The surface mounted circuit of claim 10 wherein the circuit is a hybrid circuit having more than one circuit element.

14. The surface mounted circuit of claim 13 wherein the interconnect means interconnect circuit elements.

15. The surface mounted circuit of claim 14 wherein the interconnect means are patterned.

16. A support adapted for use as a circuit board and comprising:
 a. an insulating substrate;
 b. an interfacial film thereon comprising a chemical vapor deposited metal chosen from the group consisting of a molybdenum, tungsten, manganese, and mixtures thereof; and
 c. an interconnect layer atop the interfacial film comprising a chemical vapor deposited metal chosen from the group consisting of manganese, chromium, iron, cobalt, nickel, molybdenum, tungsten, and mixtures thereof.

* * * * *